United States Patent
Plager et al.

(10) Patent No.: US 9,515,620 B2
(45) Date of Patent: Dec. 6, 2016

(54) AMPLIFIER ARRANGEMENT COMPRISING A MASTER AMPLIFIER AND AT LEAST ONE SLAVE AMPLIFIER

(71) Applicant: Robert Bosch GmbH, Stuttgart (DE)

(72) Inventors: Josef Plager, Bogen (DE); Patrick Engl, Rattiszell (DE); Thomas Stein, Regensburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/598,343

(22) Filed: Jan. 16, 2015

(65) Prior Publication Data

US 2015/0207472 A1 Jul. 23, 2015

(30) Foreign Application Priority Data

Jan. 21, 2014 (DE) ........................ 10 2014 200 971

(51) Int. Cl.
| | |
|---|---|
| H03F 3/217 | (2006.01) |
| H03F 3/183 | (2006.01) |
| H03F 3/21 | (2006.01) |
| H03F 3/181 | (2006.01) |
| H03F 3/68 | (2006.01) |

(52) U.S. Cl.
CPC .............. *H03F 3/183* (2013.01); *H03F 3/181* (2013.01); *H03F 3/211* (2013.01); *H03F 3/217* (2013.01); *H03F 3/2178* (2013.01); *H03F 3/68* (2013.01); *H03F 2200/03* (2013.01); *H03F 2200/129* (2013.01); *H03F 2200/171* (2013.01); *H03F 2200/432* (2013.01)

(58) Field of Classification Search
CPC .... H03F 2200/03; H03F 3/2173; H03F 3/217; H03F 3/2171; H03F 3/183; H03F 2200/351; H03F 3/185; H03F 1/3205; H03F 3/211; H03F 3/68; H03F 1/0205; H03F 1/0233; H03F 1/26; H03F 2200/129
USPC ........................................ 330/10, 207 A, 251
See application file for complete search history.

(56) References Cited

U.S. PATENT DOCUMENTS 7,986,187 B1 * 7/2011 Nussbaum ............ H03F 3/2178
330/207 A
8,138,832 B2 * 3/2012 Yu .......................... H03F 3/217
330/207 A
(Continued)

FOREIGN PATENT DOCUMENTS

EP 2221964 8/2010

*Primary Examiner* — Khanh V Nguyen
(74) *Attorney, Agent, or Firm* — Michael Best & Friedrich LLP

(57) ABSTRACT

An amplifier arrangement for amplifying at least one first and one second audio input signal. In one embodiment, the arrangement includes a master amplifier designed as a class D amplifier. The first audio input signal is applied to the master audio input and a master audio output signal is applied to the master audio output. The arrangement also includes a master feedback loop; thus enabling the master amplifier to be designed as a self-oscillating class D amplifier having a master oscillation frequency, at least one slave amplifier, a slave feedback loop, wherein a slave audio output signal or signal portions thereof are fed back into a slave audio input, and a master-slave coupling loop, wherein the master audio output signal or signal portions thereof is coupled into the slave audio input, so that the slave amplifier has the master oscillation frequency as its oscillation frequency.

8 Claims, 1 Drawing Sheet

(56) References Cited

U.S. PATENT DOCUMENTS

| | | | | |
|---|---|---|---|---|
| 8,144,880 B2* | 3/2012 | Chen | ............... | H03F 3/2173 |
| | | | | 330/251 |
| 8,576,003 B2* | 11/2013 | Kinyua | ............... | H03F 3/217 |
| | | | | 330/10 |
| 8,816,764 B2* | 8/2014 | Kinyua | ............... | H03F 3/217 |
| | | | | 330/10 |
| 8,937,507 B2* | 1/2015 | Cellier | ............... | H03F 3/217 |
| | | | | 330/10 |
| 9,048,791 B2* | 6/2015 | Kinyua | ............... | H03F 3/217 |
| | | | | 330/10 |

* cited by examiner

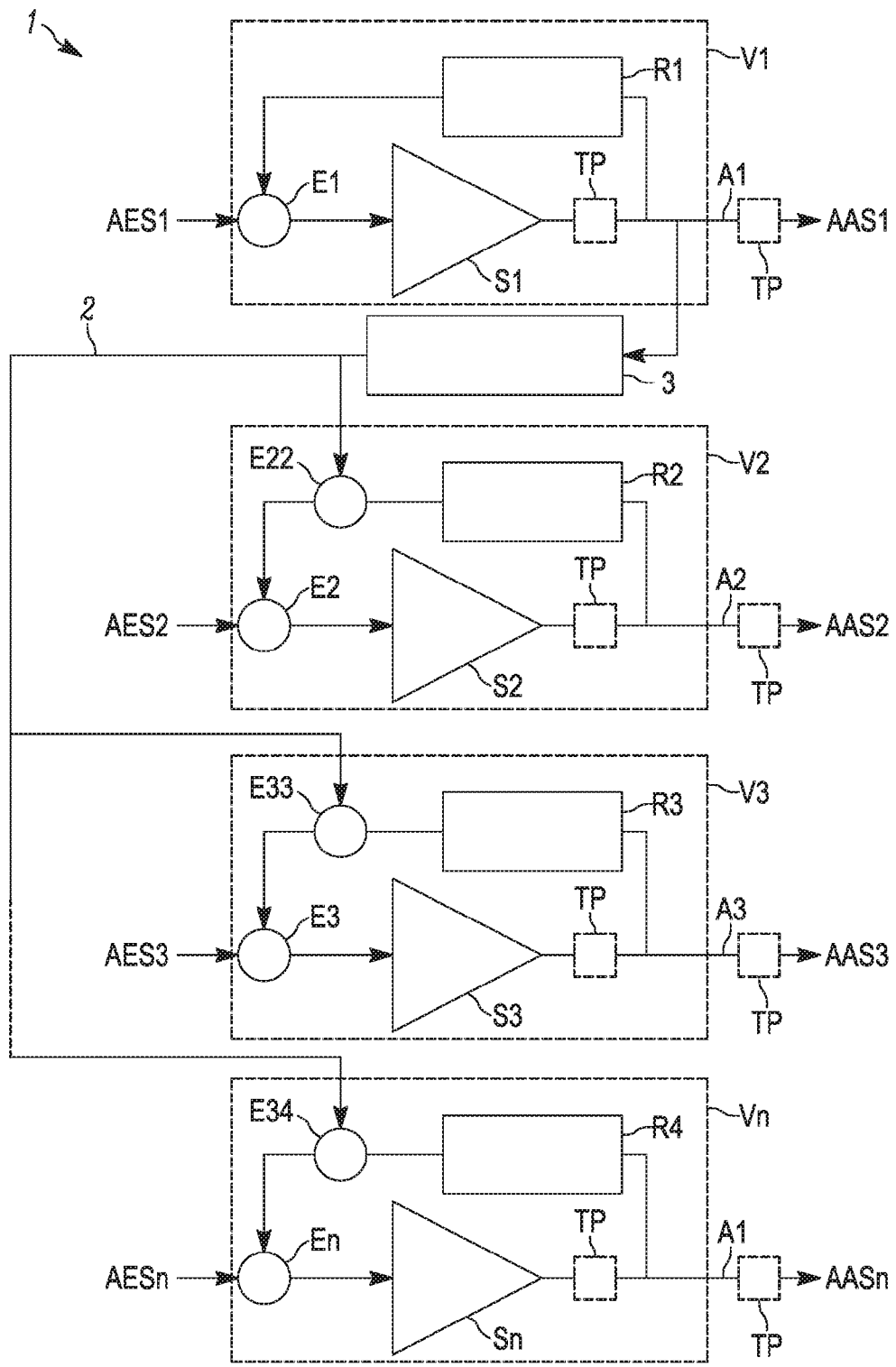

AMPLIFIER ARRANGEMENT COMPRISING A MASTER AMPLIFIER AND AT LEAST ONE SLAVE AMPLIFIER

BACKGROUND OF THE INVENTION

The invention relates to an amplifier arrangement for amplifying at least one first and one second audio input signal.

Amplifiers for audio signals are known in a plurality of designs. The amplifiers of the class D type are a particularly efficient type of amplifier. In the case of these amplifiers, the incoming audio signal is compared to a periodic signal, such as, for example, a triangular signal, in a comparator, wherein the comparator emits a pulse width modulated signal as a result of the comparison. The pulse width modulated signal is subsequently amplified in an amplifier that operates in a switching mode. The amplified, pulse width modulated signal is guided through a low-pass filter in order to again have an audio signal available as an output signal.

Amplifiers of the self-oscillating class D type represent a special type of the amplifier of the class D type described above.

The European patent publication EP 2 221 964 A1, which arguably constitutes the closest prior art, relates to such amplifiers of the class D type, said amplifiers having a feedback signal path, wherein the output signal is fed back into the input of the amplifier and the amplifier builds up a natural oscillation due to the feedback. Such amplifiers can also be disposed parallel to one another in order to implement a plurality of channels and thereby amplify a plurality of different audio signals.

SUMMARY OF THE INVENTION

The amplifier arrangement according to the invention is suited and/or designed for the amplification of at least one first and one second audio input signal. As a function of the number of channels, the amplifier arrangement can also be designed to amplify further audio input signals. The audio input signals are preferably each configured differently from one another.

The amplifier arrangement comprises a master amplifier, the master amplifier being designed as a class D amplifier. The master amplifier has a master audio input and a master audio output.

The first audio input signal is applied to the master audio input. An amplified first audio signal or an amplified, pulse width modulated first audio signal is applied as a master audio output signal to the master audio output. In particular, the master audio output can optionally be disposed downstream of a switching amplifier and upstream of a low-pass filter or downstream of the switching amplifier and downstream of the low-pass filter. Provided that a master audio output is referred to in the present description, the output of the amplified audio input signal or of the amplified, pulse width modulated audio input signal can apply in each case.

The master amplifier comprises a feedback loop, wherein the master audio output signal, in particular—as mentioned above—optionally the amplified first audio input signal or the amplified, pulse width modulated first audio input signal, or signal portions thereof, is fed back into the master audio input. For example, the master audio output signal or signal portions thereof is added to the first audio input signal. The master amplifier is particularly designed without a generator for a periodic signal for the pulse width modulation. The master amplifier is therefore designed as a self-oscillating class D amplifier having a master oscillation frequency, wherein the self-oscillation is achieved by means of the master feedback loop. The master oscillation frequency is particularly to be set equal to a switching frequency of the class D amplifier.

The amplifier arrangement further comprises at least one slave amplifier, wherein the slave amplifier is designed as a class D amplifier and has a slave audio input and a slave audio output.

The second audio input signal is applied to the slave audio input and a slave audio output signal is applied to the slave audio output. The slave audio output signal can relate to an amplified second audio input signal or an amplified, pulse width modulated second audio input signal. The slave audio output therefore lies downstream of the switching amplifier and optionally upstream or downstream of a low-pass filter of the slave amplifier.

The slave amplifier has a slave feedback loop which feeds the slave audio output signal or signal portions thereof back into the slave audio input. In particular, the master amplifier and the slave amplifier are identical in construction.

It is proposed within the scope of the invention that the amplifier arrangement has a master-slave coupling loop, which forms a signal path between the master audio output and the slave audio input, wherein the master audio output signal or signal portions thereof is coupled as a coupling signal into the slave audio input of the at least one slave amplifier; thus enabling the slave amplifier to have the master oscillation frequency as oscillation frequency, in particular switching frequency. The slave amplifier is therefore likewise designed as a self-oscillating class D amplifier, wherein the master oscillation frequency is however induced as the oscillation frequency in the slave amplifier via the master-slave coupling loop.

In principle, self-oscillating class D amplifiers can oscillate at different oscillation frequencies. The options of possible oscillation frequencies are predetermined by the design of the class D amplifier; however different modes can be triggered. If a plurality of self-oscillating class D amplifiers now run parallel and uncoupled in juxtaposition with each other, it can thus be the case that said amplifiers have different oscillation frequencies or that the oscillation frequencies change and thereby reduce the audio quality of the audio output signals as a whole. For this reason, it is advantageous for the class D amplifiers to be coupled to one another in order to implement a common oscillation frequency. This coupling is achieved in the present invention by virtue of the fact that the master amplifier not only feeds the master audio output signal back to itself but additionally couples said master audio output signal as a coupling signal into the slave amplifier(s); thus enabling said slave amplifier(s) to take on the master oscillation frequency as the preferred oscillation frequency.

It is therefore particularly preferred for the at least one slave amplifier to be synchronized to the master amplifier by means of the coupling; thus enabling the high frequency portion, in particular the master oscillation frequency signals, of the master audio output signal to be in a constant phase relationship to the high frequency portion or portions, in particular the oscillation frequency portions, of the slave audio output signals. The coupling and/or synchronization is intended to ensure that sudden changes in the oscillation frequency or phase shifts and beats, which, e.g., are thereby triggered, between the slave amplifiers and the master amplifiers, can be effectively suppressed.

In a preferred modification to the invention, the amplifier arrangement comprises a plurality of slave amplifiers, for example 3, 4, 5 or more slave amplifiers. The plurality of slave amplifiers is coupled to the master amplifier via the master-slave coupling loop; thus enabling the plurality of slave amplifiers to have in each case the master oscillation frequency as oscillation frequency.

In a particularly preferred manner, the slave amplifiers are disposed parallel to one another at the master-slave coupling loop, so that the same coupling signal is applied to each slave amplifier or, respectively, to each slave feedback loop of the respective slave amplifier. By means of this configuration, it is ensured that the master amplifier is synchronized with each slave amplifier and, as a result, the slave amplifiers are synchronized with one another.

Provision is made in a particularly preferred manner for the master amplifier and the slave amplifier or amplifiers to be identically designed. This design emphasizes the fact that the individual channels of the amplifier arrangement, which are formed by the master amplifier and the slave amplifier or amplifiers, are in principal to be designed equivalently with the distinction that the master amplifier specifies the master oscillation frequency as the oscillation frequency for the slave amplifiers.

In a preferred implementation of the invention, a high-pass filter device is disposed in the master-slave coupling loop, wherein the coupling signal is configured as the high-pass filtered master audio output signal. The reasoning behind this configuration is that crosstalk between audio input signals is to be avoided between the amplifiers, i.e. the master amplifier and the at least one slave amplifier, and/or between the channels. For this reason, portions of the signal of the master audio output signal, which are located in the audible range, are filtered out by the high-pass filter devices; and only portions of the signal are let through which have a frequency that is, for example, greater than 30 Kilohertz, preferably greater than 60 Kilohertz. In addition, said portions of the signal are suitable for modulation, in particular pulse width modulation, of the audio input signals.

In a preferred implementation of the invention, the high-pass filter device is designed to be at least a second order high-pass filter device in order to ensure that the damping of the audible signal portions in the master audio output signal is performed in a particularly strong and effective manner.

It is particularly preferred that the coupling signal is coupled into the slave audio input or the slave audio inputs without any feedback. This implementation is intended to ensure that the slave audio input signal or the slave audio output signal is not fed back into the master amplifier via the master-slave coupling loop. This configuration ensures that the master amplifier is always the amplifier that defines the common oscillation frequency and that this function cannot be assumed by the slave amplifier by means of feedback.

In an optionally complementary manner, provision is made in the invention for the master-slave coupling loop to be free of feedback such that even feedback between the slave amplifiers among themselves is prevented.

In an implementation of the invention which is preferred in terms of circuit design, the master-slave coupling loop comprises a decoupling device for coupling the coupling signal into the slave audio input without generating feedback. The decoupling device comprises, for example, an operational amplifier which is connected up in a feedback-free manner. In possible modifications to the invention, such a decoupling device is associated with each of the slave amplifiers in order to avoid a coupling of the audio signals between the slave amplifiers.

In a preferred embodiment of the invention, provision is made for the master amplifier and/or the slave amplifier to have a power output greater than 10 Watts, wherein the power output is the continuous power rating that can be maximally delivered when connected to the nominal impedance if pink noise according to DIN 45324 is supplied. The audio amplifier system is particularly designed to amplify signals of an audio source or a plurality of audio sources, such as, e.g., a playback device, a plurality of microphones and/or pick-ups in instruments.

BRIEF DESCRIPTION OF THE DRAWINGS

Further features, effects and advantages of the invention ensue from the following description of a preferred exemplary embodiment of the invention as well as from the attached drawing. In the drawing:

FIG. 1 shows a schematic block diagram of an amplifier arrangement as an exemplary embodiment of the invention.

DETAILED DESCRIPTION

FIG. 1 shows an amplifier arrangement 1 in a schematic block depiction. The amplifier arrangement serves to convert a first, second, third and if need be nth audio input signal AES1, AES2, AES3, AESn at an audio input E1, E2, E3, En to an audio output signal AAS1, AAS2, AAS3, AASn at an audio output A1, A2, A3, An, wherein the audio output signal AAS1, AAS2, AAS3, AASn is formed in each case as an amplified audio input signal or as an amplified, pulse width modulated audio input signal. Each of the signal paths AES1-AAS1, AES2-AAS2, AES3-AAS3, AESn-AASn form a channel I, II, III, n.

An amplifier V1, V2, V3, Vn is disposed in each of the channels I, II, III, n, each of the amplifiers V1, V2, V3, Vn being designed as a class D amplifier. Each of the amplifiers V1, V2, V3, Vn has an associated switching amplifier S1, S2, S3, Sn which comprises at least one power switch. In addition, each of the amplifiers V1, V2, V3, Vn has an associated feedback loop R1, R2, R3, Rn which feeds the audio output signal AAS1, AAS2, AAS3, AASn from the audio output A1, A2, A3, An back into the audio input E1, E2, E3, En of the amplifiers V1, V2, V3, Vn.

Depending on the design, a low-pass filter device TP can be disposed in each case upstream of the audio output A1, A2, A3, An; thus enabling the output signal AAS1, AAS2, AAS3, AASn to be formed in each case as the amplified audio input signal. As an alternative thereto, the low-pass filter device TP is disposed downstream of the audio output A1, A2, A3, An; thus enabling the audio output signal AAS1, AAS2, AAS3, AASn to be formed as an amplified, pulse width modulated audio input signal.

The audio output signal AAS1, AAS2, AAS3, AASn which was fed back is added to the audio input signal at the audio input E1, E2, E3, En and delivered to the switching amplifier S1, S2, S3, Sn. The amplifiers V1, V2, V3, Vn are actuated as self-oscillating amplifiers by means of the feedback loop R1, R2, R3, Rn; thus enabling the signal necessary for the pulse width modulation to be generated and maintained by the self-oscillation.

Despite identical design, the amplifiers V1, V2, V3, Vn can assume different oscillation frequencies during operation and can furthermore change oscillation frequencies during operation. In this regard, dimensional tolerances, the effects of temperature or even power requests at the amplifiers V1, V2, V3, Vn can, for example, lead to changes in the oscillation frequencies.

In order to ensure that the amplifiers V1, V2, V3, Vn operate with the same oscillation frequency, the amplifier arrangement 1 is designed as a master-slave arrangement, wherein the amplifier V1 is designed as a master amplifier V1 in the exemplary embodiment depicted. Hence, the feedback loop R1 thereof can be denoted as master feedback loop, the audio output A1 thereof as master audio output A1, the audio output signal AAS1 thereof as master audio output signal AAS1 and the audio input E1 thereof as master audio input E1. The oscillation frequency of the master amplifier V1 as a self-oscillating class D amplifier is denoted as master oscillation frequency. The amplifiers V2, V3, Vn are, on the other hand, designed as slave amplifiers V2, V3, Vn, so that the feedback loops R2, R3, Rn thereof can be denoted as slave feedback loops R2, R3, Rn, the audio outputs A2, A3, An thereof as slave audio outputs A2, A3, An, the audio output signals AAS2, AAS3, AASn thereof as slave audio output signals AAS2, AAS3, AASn and the audio inputs E2, E3, En thereof as slave audio inputs E2, E3, En.

A master-slave coupling loop 2 is arranged to originate at the master audio output A1, said master-slave coupling loop guiding the master audio output signal AAS1 or signal portions thereof as a coupling signal into the feedback loops R2, R3, Rn of the amplifiers V2, V3, Vn to be denoted as slave amplifiers. In so doing, the complete master audio signal AAS1 is however not transmitted but only the high-pass filtered master audio output signal AAS1 is transmitted further as a coupling signal, wherein a high-pass filter device 3 is disposed between the audio output A1 of the master amplifier V1 and inputs to the feedback loop R2, R3, Rn of the slave amplifiers V2, V3, Vn.

The high-pass filter device 3 has a critical frequency which lies significantly above the audible range, that is to say, for example, above 30 Kilohertz or 60 Kilohertz. The high-pass filter device is, for example, designed as a higher order filter device, i.e. at least of the second order, in order to ensure that audio portions of the audio input signal AES1 are suppressed in the master audio output signal AAS1 in order to suppress a crosstalk of the master audio input signal AES1 from the channel I to the other channels II, III, n.

The coupling of the high-pass filtered master audio output signal 1 can take place in a region of the feedback loop R2, R3, Rn or at the audio input E2, E3, En. Finally, it is important that the high-pass filtered master audio input signal AAS1 is added to the audio input signal AES2, AES3, AESn, so that signal portions having a master oscillation frequency that prevails in the high-pass filtered master audio output signal AAS1 can be added to the audio input signals AES2, AES3, AESn in order to induce the slave amplifiers V2, V3, Vn to a self-oscillation having an oscillation frequency that corresponds to the master oscillation frequency.

The master-slave coupling loop 2 therefore ensures that the slave amplifiers V2, V3, Vn and the master amplifier V1 have the same oscillation frequency, namely the master oscillation frequency, during operation. In addition, the oscillation frequencies of the master amplifier V1 and those of the slave amplifiers V2, V3, Vn can be in a fixed and/or constant phase position with respect to each other.

Provision is made according to the invention for the high-pass filter device 3 to be designed in a feedback-free manner so that no signal portions from the slave amplifiers V2, V3, Vn can be fed back in the direction of the master amplifier V1. The high-pass filter device 3 can, for example, comprise a decoupling device including an operational amplifier. In an optionally complementary manner, provision can be made for a further decoupling device (not shown) to be disposed upstream of each slave amplifier V2, V3, Vn in order to avoid a crosstalk of audio input signals AES2, AES3, AESn between the slave amplifiers V2, V3, Vn.

The particular advantages of the amplifier arrangement 1 are that the coupling, in particular the synchronization, occurs only in one direction, namely from the master amplifier V1 to the slave amplifiers V2, V3, Vn. It can thereby be determined that the master amplifier V1 comprising the channel I forms the guiding channel. In addition, there cannot be an interference of the guiding channel I by the other channels II, III, n. Any number of channels II, III, n can theoretically be coupled, in particular synchronized, by means of the guiding channel I. The coupling, in particular synchronization, can be implemented by means of cost effective standard components. The coupling, in particular synchronization, takes place exclusively in the high frequency range outside of the audible range. The useful signal in the low frequency range is greatly suppressed by the high-pass filter device and for that reason not transmitted to the other channels II, III, n.

The master audio output signal AAS1 of the guiding channel I is tapped during operation. By means of the high-pass filter device 3, the switching frequency is extracted as the oscillation frequency from the master audio output signal AAS1. As a result, no significant portions of the useful signal of the audio input signal AES1 are subsequently contained in the high-pass filtered master audio output signal AAS1. The signal which is obtained in this manner and corresponds to the high-pass filtered master audio output signal AAS1 is fed without feedback, for example by means of an operational amplifier, at a suitable location into the feedback loop R2, R3, Rn of any number of channels II, III, n. Hence, all channels I, II, III, n run with exactly the same switching frequency, wherein channel I is always the guiding channel. In addition, no large power components are required to this end because the coupling, in particular synchronization, occurs exclusively in the small signal portion.

The invention claimed is:
1. An amplifier arrangement for amplifying at least one first and one second audio input signal, the amplifier arrangement comprising:
   a master amplifier, wherein the master amplifier is designed as a class D amplifier, said master amplifier having a master audio input and a master audio output, wherein the first audio input signal is applied to the master audio input and an amplified first audio input signal is applied as a master audio output signal to the master audio output,
   a master feedback loop, wherein the master audio output signal is fed back into the master audio input; thus enabling the master amplifier to be designed as a self-oscillating class D amplifier having a master oscillation frequency,
   at least one slave amplifier, the slave amplifier being designed as a class D amplifier, wherein the slave amplifier has a slave audio input and a slave audio output, wherein the second audio input signal is applied to the slave audio input and an amplified second audio input signal is applied as a slave audio output signal to the slave audio output,
   a slave feedback loop, wherein the slave audio output signal is fed back into the slave audio input, and
   a master-slave coupling loop, wherein the master audio output signal is coupled as a coupling signal into the slave audio input, so that the slave amplifier has the master oscillation frequency as its oscillation frequency.

2. The amplifier arrangement according to claim 1, wherein the at least one slave amplifier is synchronized to the master amplifier.

3. The amplifier arrangement according to claim 1, further comprising a plurality of slave amplifiers, wherein the slave amplifiers are coupled to the master amplifier via the master-slave coupling loop and have the master oscillation frequency as their oscillation frequency.

4. The amplifier arrangement according to claim 1, wherein the master amplifier and the slave amplifier are identically constructed.

5. The amplifier arrangement according to claim 1, wherein a high-pass filter device is disposed in the master-slave coupling loop, the coupling signal being formed as the high-pass filtered master audio output signal.

6. The amplifier arrangement according to claim 5, wherein the high pass filter device is at least of a second order.

7. The amplifier arrangement according to claim 1, wherein the master-slave coupling loop has a decoupling device for the feedback-free coupling of the coupling signal into the slave audio input, the decoupling device including an operational amplifier.

8. The amplifier arrangement according to claim 1, wherein the master amplifier has, the slave amplifier has, or both the master amplifier and the slave amplifier have a power output greater than 10 watts.

* * * * *